United States Patent [19]

Liu

[11] Patent Number: 5,126,508
[45] Date of Patent: Jun. 30, 1992

[54] ANTI-ELECTROMAGNETIC INTERFERENCE STRIP FOR A KEYBOARD PLUG OF A COMPUTER

[75] Inventor: Morgan C. Liu, Taoyuan, Taiwan
[73] Assignee: Enlight Corporation, Takang, Taiwan
[21] Appl. No.: 655,652
[22] Filed: Feb. 14, 1991
[51] Int. Cl.⁵ .............................................. H05K 9/00
[52] U.S. Cl. .................................. 174/35 GC; 24/563
[58] Field of Search .............. 47/41.12; 428/121, 122, 428/124; 24/563; 174/35 R, 35 GC

[56] References Cited

U.S. PATENT DOCUMENTS

| | | | |
|---|---|---|---|
| 2,278,773 | 4/1942 | Erdmann | 428/23 X |
| 2,751,653 | 6/1956 | Leibow | 24/563 X |
| 3,592,721 | 7/1971 | Formanek et al. | 428/121 |
| 4,418,496 | 12/1983 | Koistinen | 47/41.12 |
| 4,564,548 | 1/1986 | Fast | 428/121 |
| 4,739,582 | 4/1988 | Cullinane | 47/41.12 |
| 4,909,579 | 3/1990 | Liu | 220/331 X |
| 5,015,802 | 5/1991 | Chi | 174/35 GC |

Primary Examiner—Henry F. Epstein
Attorney, Agent, or Firm—Ladas & Parry

[57] ABSTRACT

A resilient U-shaped, electrically conductive strip of which one limb has an end bent backward to form a hook and the other limb has a further-extended end. The strip is so formed that when the hook pinches the mother board of a computer and the further-extended end makes contact with the casing of the computer and thus forming an electrical connection therebetween. The electromagnetic waves generated by the computer are conducted to the casing and not allowed to leak out of the computer.

5 Claims, 2 Drawing Sheets

ANTI-ELECTROMAGNETIC INTERFERENCE STRIP FOR A KEYBOARD PLUG OF A COMPUTER

FIELD OF THE INVENTION

The present invention relates generally to an anti-EMI (electromagnetic interference) device and in particular to an electrically conductive strip connected between the keyboard socket, which is fixed on the mother board of the computer, and the casing of the computer so as to conduct the electromagnetic waves generated during the operation of the computer to the casing and to prevent the waves from leaking through the plugging hole of the keyboard plug.

BACKGROUND OF THE INVENTION

As everybody knows, electronic devices, when in operation, generate electromagnetic waves. Some of these waves are vital to the operations of the devices generating them, while others are unnecessary or have negative effects.

In recent years, computers have been widely used. The EMI problem resulting from the wide use of computers is becoming more and more common and serious. The higher the operation speed of the computer, the more serious the EMI problem. Therefore, many countries have established inspection and test standards to test electronic devices so as to control the EMI problems. One of the most famous tests is given by the Federal Communication Commission of the United States of America.

SUMMARY OF THE INVENTION

It is therefore an object of the present invention to provide a device to prevent electromagnetic waves generated by a computer from leaking out of the computer so as to reduce the EMI resulting therefrom.

It is another object of the invention to provide an anti-EMIT strip connecting between the mother board and the casing of a computer so as to conduct the electromagnetic waves generated by the mother board to the casing and thus preventing the waves from leaking ut of the computer through the plugging hole of a keyboard plug.

To achieve these aims, there is provided a resilient U-shaped, electrically conductive strip of which one limb has an end bent backward to form a hook and the other limb has a further-extended end. The strip is so formed that when the bent end pinches the mother board and is retained thereon by a retainer, the further-extended end makes contacts with the casing of the computer and thus forming an electrical connection therebetween. The electromagnetic waves generated by the mother board are thus conducted to the casing and not allowed to leak out of the computer.

The objects and other aspects and advantages of the invention will become apparent from the following detailed description of the preferred embodiment, reference being made to the accompanying drawings:

DETAILED DESCRIPTION OF PREFERRED EMBODIMENT

Figure 1:
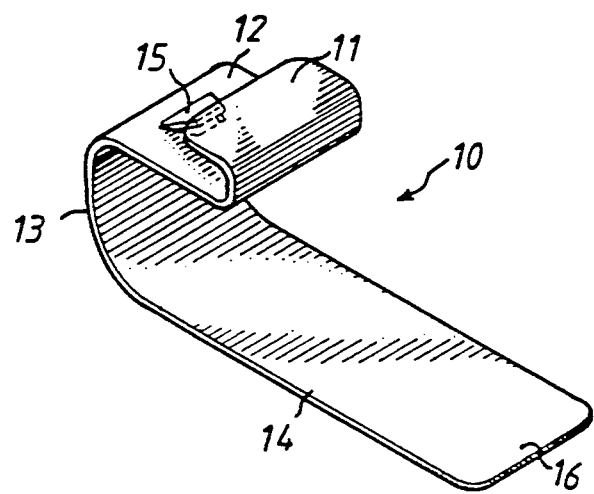
FIG. 1 is a perspective view of an anti-EMI strip in accordance with the present invention.
Figure 2:
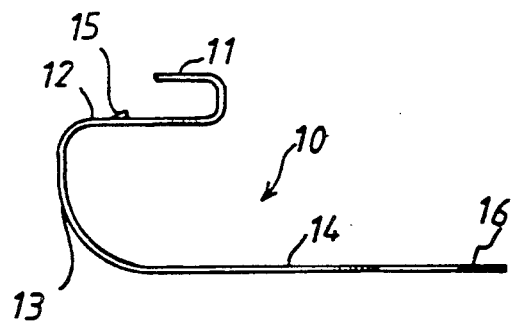
FIG. 2 is a side view of the strip shown in FIG. 1.

With reference to FIGS. 1 and 2, an anti-EMI strip at 10 in accordance with the invention generally has a U-shape comprising a first limb 12 having an end bent backward to form a hook 11 on one side of the first limb 12 that is shorter than the first limb 12 and an opposite end bent backward to form a bottom 13 that extends to one end of a second limb 14 on the opposite side of the first limb 12 that is longer than the first limb 12 to have a further-extended end 16 therebeyond.

Formed on the first limb 12 is a retainer 15 which is a projection toward formed by punching.

Figure 3:
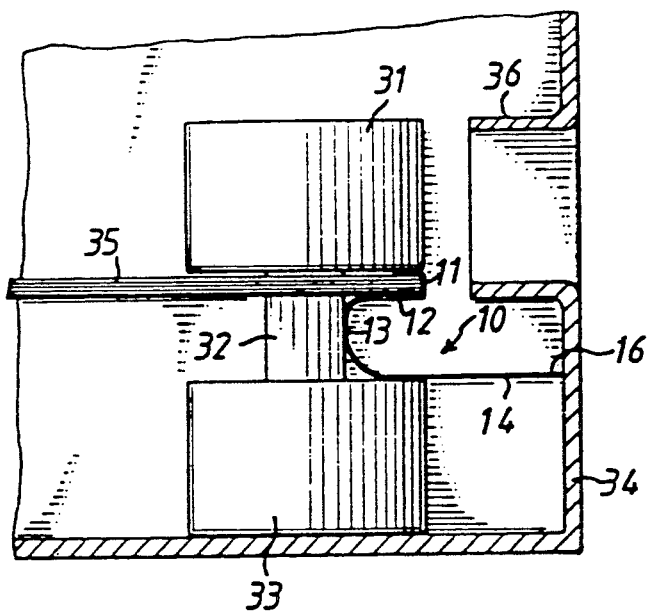
FIG. 3 is a cross-sectional view showing the installation of the strip of FIG. 1 in a computer.

With reference to FIG. 3, when the hook 11 pinches the mother board 35, the bottom 13 abuts against a fastening device 32 which fixes the mother board 35 on a support 33 of the casing 34, and the further-extended end 16 of the second limb 14 makes contacts with the casing 34 at a location in the proximity of a plugging hole 36, which is formed on the casing 34 and through which a keyboard plug (not shown) is inserted to engage with a socket 31 integrated on the mother board 35. An electrical connection is therefore formed between the mother board 35 and the casing 34 and the electromagnetic waves generated by the computer are conducted by the strip 10 to the computer through the gap between the plugging hole 36 and the keyboard plug (not shown) engaging with the socket 31.

The retainer 15 formed on the first limb 12 of the U-shaped strip 10 engages with the method board 35 to retain the U-shaped strip 10 in position.

It is obvious to those skilled in the art that the present invention provides a device which prevents electromagnetic waves generated by a computer from leaking out of the gap between a plugging hole for a keyboard plug and the keyboard plug inserted therein.

It is apparent that although the invention has been described in connection with the preferred embodiment, it is contemplated that those skilled in the art may make changes to certain features of the preferred embodiment without departing from the spirit and scope of the invention as defined in the appended claims.

What is claimed is:

1. An anti-electromagnetic interference strip for a keyboard plug hole of a computer, comprising:
a strip of resilient, electrically conductive material having a first limb (12) having an end bent one way from the first limb (12) and backward to form a hook (11) on one side of the first limb (12) that is shorter than the first limb (12) and an opposite end bent oppositely to form a bottom (13) that extends to one end of a backward-extending second limb (14) on an opposite side of the first limb (12), the second limb (14) being longer than the first limb (12) to have an opposite farther-extended end (16) therebeyond, whereby, when said hook pinches a motor board of the computer, the farther-extended end of the second limb contacts a casing of the computer at a suitable location to form an electrical connection between the mother board and casing.

2. A strip as claimed in claim 1, wherein said suitable location of the contact of the second limb to the casing is a location in the proximity of a hole into the casing for a keyboard plug to be inserted to engage a socket disposed on the mother board.

3. A strip as claimed in claim 1, and further comprising a retainer (15) on the on side of the first limb between the hook and the opposite, bottom ends thereof, whereby to engage said mother board and keep said strip in position.

4. A strip as claimed in claim 3, wherein said retainer is a projection formed by punching.

5. An anti-electromagnetic interference strip for a keyboard plug hole of a computer, said strip, being U-shaped and made of resilient, electrically conductive material, comprising:
(a) a first limb having an end bent backward to form a hook on one side of the first limb;
(b) a second limb on an opposite side of said first limb and having a farther-extended end;
(c) a bottom connected between said first limb and said second limb; and
(d) a retainer on said one side of said first limb between the hook thereof and the bottom of said U-shaped strip;

whereby said hook pinches a mother board of the computer, said retainer engages with said mother board and keeps said strip in position, and said farther-extended end of the second limb makes contact with a casing of the computer in proximity of a hole which is formed on the casing and through which a keyboard plug is inserted to engage a socket disposed on the mother board so as to form an electrical connection between said mother board and said casing.

* * * * *